Figure 1:
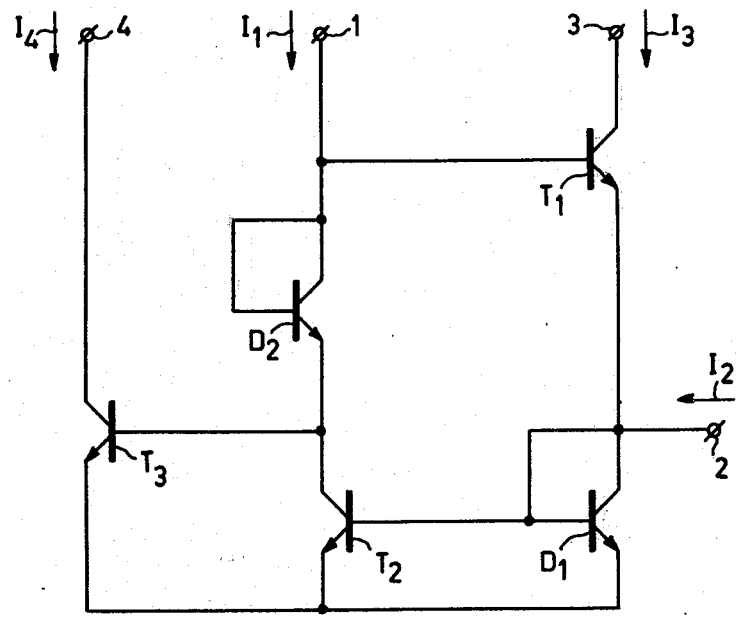

United States Patent [19]

van de Plassche

[11] 4,013,973

[45] Mar. 22, 1977

[54] AMPLIFIER ARRANGEMENT

[75] Inventor: Rudy Johan van de Plassche, Eindhoven, Netherlands

[73] Assignee: U.S. Philips Corporation, New York, N.Y.

[22] Filed: July 17, 1975

[21] Appl. No.: 596,663

[30] Foreign Application Priority Data

July 22, 1974 Netherlands ............. 7409851

[52] U.S. Cl. .................. 330/30 D; 330/17; 330/19; 330/22

[51] Int. Cl.² ............................ H03F 3/45

[58] Field of Search ............... 330/17, 18, 19, 22, 330/30 D

[56] References Cited

UNITED STATES PATENTS

| | | | |
|---|---|---|---|
| 3,701,032 | 10/1972 | Steckler | 330/18 |
| 3,760,288 | 9/1973 | Leonard | 330/17 X |

Primary Examiner—Palmer C. Demeo
Assistant Examiner—Lawrence J. Dahl
Attorney, Agent, or Firm—Frank R. Trifari; Bernard Franzblau

[57] ABSTRACT

An amplifier arrangement with a first input circuit and an output circuit, which output circuit is constituted by the series connection of the collector-emitter path of a first transistor and a diode, while the first input circuit is constituted by the series connection of a second diode and the collector-emitter path of a second transistor, whose base-emitter junction is shunted by the first diode. A second input circuit is obtained in that an input connection point is connected to the base of the second transistor. The amplifier arrangement comprises a second output circuit, which is constituted by the collector-emitter path of a third transistor, whose base is connected to the collector of the second transistor. An important application of said amplifier arrangement is as a high-frequency driver stage for a class-B push-pull output stage.

12 Claims, 2 Drawing Figures

AMPLIFIER ARRANGEMENT

The invention relates to an amplifier arrangement having a first input circuit and an output circuit, which output circuit includes the series connection of the collector-emitter path of a first transistor and a first semiconductor junction. The first semiconductor junction shunts the base-emitter junction of a second transistor, which has its collector-emitter path included in the first input circuit. The collector of the second transistor is coupled to the base of the first transistor. A second input circuit is formed by connecting an input connection terminal to a junction point in the connection line between the emitter of the first transistor and the first semiconductor junction.

Such an amplifier arrangement is known from the published Netherlands Patent Application No. 6,915,477 corresponding to U.S. Pat. No. 3,697,882 and is in particular intended to be used as a driver stage in integrated operational amplifiers.

In known operational amplifiers a transistor is connected as a current source and provides the quiescent current setting of a class-B output stage. The collector capacitance C of said transistor limits the bandwidth of the output stage because said capacitance also determines the maximum rate at which the collector voltage of said transistor can follow the signal voltage. This is because:

$$\frac{dV}{dt} = \frac{I}{C}$$

for the voltage $V$ across a capacitor $C$, $I$ being the current which flows through the capacitor and $t$ the time. From the equation it follows that the maximum rate can be increased by increasing the capacitor current $I$. In said output stage this may be effected by controlling the current source with the signal to be amplified for high signal frequencies. As a result of this the need has arisen for a driver amplifier with at least two output signalcurrents. In the known amplifier arrangement this can be realized by applying the output signal current to a current mirror having a multiplicity of outputs. Apart from the number of transistors, said solution has the drawback that the transistors of said current mirror will be of a conductivity type opposite to the conductivity type of the transistors of the first-mentioned amplifier. In integrated circuits, as is known, such transistors (usually pnp) take the form of lateral transistors for technological reasons and, with respect to their high frequency properties, they are appreciably worse than said first and second transistors, which take the form of vertical (usually npn) transistors.

It is an object of the invention to provide the known amplifier arrangement with at least one additional output in a simple manner and the invention is therefore characterized in that the collector of the second transistor is connected to the base of a third transistor and via a second semiconductor junction to the base of the first transistor. The emitter of the third transistor is connected to the emitter of the second transistor. A second output signal current then is available at the collector of the third transistor.

Figure 2:
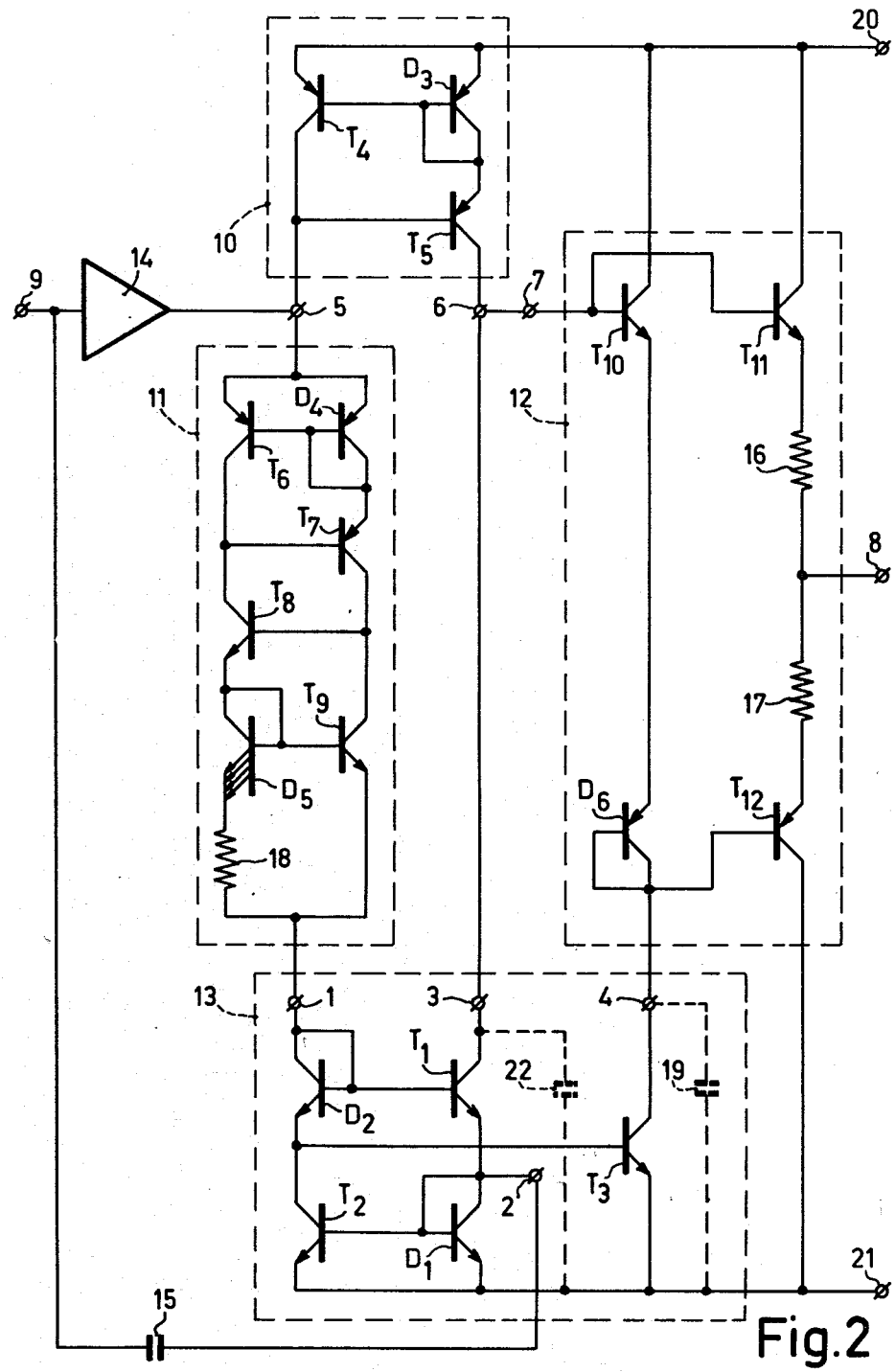

The invention will be described in more detail with reference to the FIGS., in which FIG. 1 shows an embodiment of an amplifier according to the invention, and FIG. 2 shows an example of an application of an amplifier according to the invention.

The amplifier of FIG. 1 comprises a first transistor $T_1$ whose base is connected to an input connection point 1, whose emitter is connected to an input connection point 2 and whose collector is connected to an output connection point 3. The emitter of transistor $T_1$ is moreover connected to the base and the collector of a transistor $D_1$ which is connected as a diode and whose emitter is connected to the emitter of a transistor $T_2$. The base of transistor $T_2$ is connected to the base of the transistor $D_1$ and the collector is connected via a transistor $D_2$ which is connected as a diode, to the base of the transistor $T_1$. The collector of transistor $T_2$ also is connected to the base of a transistor $T_3$ whose emitter is connected to the emitter of transistor $T_2$ and whose collector is connected to an output connection point 4. The currents $I_1$, $I_2$, $I_3$ and $I_4$ flow through the connection points 1, 2, 3 and 4 respectively, as shown in the FIGURE.

If the base currents of the various transistors are neglected and if the emitter area of transistor $T_2$ equals the emitter area of the transistor $D_1$, which transistor is connected as a diode, the current $I_1$ which flows through the collector-emitter path of transistor $T_2$, when the circuit arrangement takes the form of an integrated circuit, equals the current $I_2 + I_3$, which flows through the transistor $D_1$. Hence, through the transistor $D_2$ also connected as a diode, the same current will flow as through the transistor $D_1$. Furthermore, the sum of the base-emitter voltage of the transistor $T_1$ and the voltage across the transistor $D_1$ equals the sum of the voltage across the transistor $D_2$ and the base-emitter voltage of transistor $T_3$. If the emitter areas of the transistors $D_1$ and $D_2$, which are connected as diodes, are equal, the voltage across said transistors connected as diodes are equal and the base-emitter voltage of transistor $T_3$ equals the base-emitter voltage of transistor $T_1$. The output current $I_4$, which flows through the collector-emitter path of transistor $T_3$, then bears a fixed ratio to the output current $I_3$, which flows through the collector-emitter path of transistor $T_1$ and which is equal to $I_1 - I_2$. When the emitter areas of the transistors $T_1$ and $T_3$ are equal, said fixed ratio equals 1.

When said emitter areas are not equal, said ratio equals the ratio of the emitter areas of the transistors $T_1$ and $T_3$.

The circuit arrangement of FIG. 1 may simply be extended to provide several outputs by connecting the base-emitter junctions of several transistors in parallel with the base-emitter junction of transistor $T_3$, which in integrated circuits is generally realized by replacing transistor $T_3$ by a multiple-collector transistor. In principle, said step may also be applied to transistor $T_1$. However, a drawback of the latter arrangement is that the sum of the (multiple) collector currents equals the difference between the two input currents.

As previously stated, the circuit arrangement of FIG. 1 may be employed as a driver stage in operational amplifiers. For high frequencies the current source which determines the quiescent-current setting of the output stage must be driven with the signal to be amplified. Moreover, in operational amplifiers a preamplifier is shunted by a capacitor for a suitable drop in gain at high frequencies. By the use of the circuit arrangement according to the invention the two steps are combined and, moreover, said current source is combined with the circuit arrangement according to the invention, as will appear from the description of FIG. 2.

FIG. 2 shows an example of an application of the amplifier according to the invention. The amplifier, which is shown within the dashed block 13, has reference letters and numerals corresponding to FIG. 1. The circuit arrangement of FIG. 2 has a signal input connection point 9, which via a preamplifier 14 is connected to an input connection point 5 of a current mirror circuit shown within the dashed block 10. Via a current source circuit, represented by the dashed block 11, said input connection point 5 is also connected to the input connection point 1 of the circuit arrangement according to the invention. The output connection point 3 of the circuit arrangement according to the invention is connected to the output connection point 6 of the current mirror circuit 10. Said output connection point 6 is also connected to the input connection point 7 of an output stage shown within the dashed block 12. The input connection point 9 is also connected via a capacitor 15 to the input connection point 2 of the circuit arrangement according to the invention.

The current source circuit 11 comprises two parallel current paths which are mutually coupled by a current mirror circuit consisting of the transistors $T_6$ and $T_7$ and the transistor $D_4$, which is connected as a diode, so that the currents which flow through the two current paths bear a fixed ratio to each other. The one current path includes the collector-emitter path of a transistor $T_9$, whose base-emitter junction is shunted by the series-connection of a resistor 18 and a transistor $D_5$, which is connected as a diode, which series connection is included in the other current path emitter area of said transistor $D_5$ has been enlarged relative to the emitter area of transistor $T_9$, which is symbolically represented by the multiple emitter arrow. As the two currents are coupled by the current mirror, only one set of currents exists, except for the currents equal to zero, at which the base-emitter voltage of transistor $T_9$ equals the voltage across the series connection of the diode $D_5$ and the resistor 18, so that the circuit in block 11 constitutes a current source.

The current source circuit 10 comprises an input circuit which connects the input connection point 5 to a positive supply point 20, and an output circuit which connects the output connection point 6 to the positive supply point 20. The output circuit includes the series connection of the collector-emitter path of a transistor $T_5$ and a transistor $D_3$, which is connected as a diode. The diode $D_3$ shunts the base-emitter junction of a transistor $T_4$ whose collector-emitter path is included in the input circuit. The current mirror operation is based on the equality of the base-emitter voltage of the transistor $T_4$ to the voltage across the diode $D_3$.

Between the supply connection points 20 and 21 is connected the output stage 12, which comprises two transistors $T_{11}$ and $T_{12}$ whose emitters are connected via the emitter resistors 16 and 17 respectively to an output connection point 8. The base of transistor $T_{11}$ is connected to the base of a transistor $T_{10}$. The collector of transistor $T_{10}$ is connected to the positive supply point 20 and is base is connected to the input connection point 7 of the output stage. The emitter of $T_{10}$ is connected to the base of transistor $T_{12}$ via a transistor $D_6$, which is connected as a diode. The base of transistor $T_{12}$ is moreover connected to the collector of transistor $T_3$. The collector of $T_3$, via a stray capacitance 19, is connected to the negative supply point 21, which in integrated circuits is usually substrate. Similarly, the collector of transistor $T_1$ is connected to the negative supply point 21 via a stray capacitance 22. When transistor $T_3$ carries a constant current, the voltage difference between the bases of the transistors $T_{11}$ and $T_{12}$ will be constant. When a signal voltage is applied to the input connection point 7, said signal voltage will appear both at the base of transistor $T_{11}$ and the base of transistor $T_{12}$. In the case of a periodic signal the transistors $T_{11}$ and $T_{12}$ will alternately amplify said signal in push-pull. The signal current is available at output connection point 8.

For low frequency signals at the input connection point 9 the capacitor 15 constitutes a high impedance. Consequently, no input signal is applied to the input connection point 2 of the circuit arrangement according to the invention. As the constant current from current source circuit 11 flows through the input connection point 1, both the current which flows through the output connection point 3 and the current which flows through the output connection point 4 is constant. Transistor $T_3$ thus operates as a constant current source for the output stage 12 for low frequency signals and transistor $T_1$ operates as an active collector impedance for transistor $T_5$. The low frequency signal which is amplified by the preamplifier 14, together with the current which is supplied by the current source circuit 11, flows through the input circuit of the current mirror circuit 10. Consequently, a constant current and a signal current will flow through the output circuit of the current mirror arrangement 10. As a result of the collector impedance of transistor $T_5$ said signal current causes a signal voltage at the input connection point 7 of the output stage, which collector impedance consists of the input impedance of the output stage 12 and the collector input impedance of transistor $T_1$. The stray capacitance 22 has no effect on the impedance at these low frequencies. As the constant collector current of transistor $T_3$ flows through the collector-emitter path of transistor $T_{10}$ and through the diode $D_6$, there will be a constant voltage difference between the bases of the transistors $T_{11}$ and $T_{12}$ so that the signal voltage, which is available at the input connection point 7, also appears at the base of transistor $T_{12}$.

For high frequency signals the series connection of the capacitor 15 and the diode $D_1$ forms a comparatively low impedance relative to the input impedance of the preamplifier 14, so that said preamplifier receives no input signal current. Thus, no signal current is applied to the input connection point 5 of the current mirror circuit 10, but only the constant current from the current source circuit 11. As a result, the collector current of transistor $T_5$ is constant and said transistor constitutes an active collector impedance for transistor $T_1$. The input signal current at the input connection point 9 is applied to the input connection point 2 of the circuit arrangement according to the invention via the capacitor 15, while the constant current from current source circuit 11 is applied to the input connection point 1. Thus, a constant current and signal current flows through the collector circuit of transistor $T_1$, which signal current causes a signal voltage at the connection point 7 of the output stage 12 owing to the collector impedance of transistor $T_1$, which collector impedance is mainly determined by the stray capacitance 22. A similar constant current and signal current flows through the collector circuit of transistor $T_3$, which signal current causes a signal voltage across the stray capacitance 19 so that the collector of transistor $T_3$ and thus the base of transistor $T_{12}$ can more readily follow the signal voltage at the input connection point 7. An optimum situation is then obtained when the stray capacitance 19 is of the same order of magnitude as the stray capacitance 22. The stray capacitance 22 is mainly caused by the capacitance of the collector island of the npn-transistor $T_1$ relative to the substrate, while the stray capacitance 19 consists of the capacitance of the collector island of the npn-transistor $T_3$ relative to the substrate and the capacitances of the base islands of the pnp-transistors $D_6$ and $T_{12}$ relative to the substrate, so that the stray capacitance 19 will be higher than the stray capacitance 22. In that case an optimum situation can be obtained by correspondingly enlarging the emitter area of transistor $T_3$ relative to the emitter area of transistor $T_1$ so that the ratio between stray capacitance and signal current is the same for the two transistors.

What is claimed is:

1. An amplifier comprising, first and second input terminals, first and second output terminals, a common terminal, a first transistor, means connecting the collector-emitter path of the first transistor in series with a first semiconductor junction between the first output terminal and the common terminal so as to form a common junction point between the first transistor and the first semiconductor junction, a second transistor, means connecting a second semiconductor junction in series with the collector-emitter path of the second transistor between the first input terminal and the common terminal, means connecting the first semiconductor junction in shunt with the base-emitter junction of the second transistor, means connecting the base of the first transistor to the first input terminal, a third transistor with its collector-emitter path connected between the second output terminal and the common terminal, means connecting the base of the third transistor to the collector of the second transistor, and means connecting said second input terminal to said common junction point between the first transistor and the first semiconductor junction.

2. An amplifier as claimed in claim 1 wherein said first and second input terminals, said first and second output terminals, and said common terminal are electrically separate from one another.

3. An amplifier as claimed in claim 1 wherein said first, second and third transistors are of the same conductivity type.

4. An amplifier as claimed in claim 3 wherein said first and second semiconductor junctions comprise fourth and fifth transistors of the same conductivity type as the first, second and third transistors, said fourth and fifth transistors being connected as diodes.

5. An amplifier as claimed in claim 1 wherein said first, second and third transistors are NPN transistors with the collector of the first transistor directly connected to the first output terminal, the collector of the third transistor directly connected to the second output terminal, and the emitters of the second and third transistors directly connected to the common terminal.

6. An amplifier as claimed in claim 5 wherein said first transistor and said first semiconductor junction are serially connected in the order named between the first output terminal and the common terminal and the second semiconductor junction and the second transistor are serially connected in the order named between the first input terminal and the common terminal.

7. An amplifier as claimed in claim 1 wherein said first transistor and said first semiconductor junction are connected with the same polarity between the first output terminal and the common terminal and said second semiconductor junction and said second transistor are connected with the same polarity between the first input terminal and the common terminal.

8. An amplifier as claimed in claim 1 wherein the second semiconductor junction and the second transistor are serially connected in the order named between the first input terminal and the common terminal so that the collector of the second transistor is coupled to the base of the first transistor via the second semiconductor junction.

9. An operational amplifier comprising an op-amp input terminal and output terminal, a drive amplifier, a current source circuit, and a push-pull output amplifier, said drive amplifier comprising, first and second input terminals, first and second output terminals, a common terminal, first, second and third transistors, first and second semiconductor junction devices, means serially connecting the first transistor and the first junction device between the first output terminal and the common terminal and with the same polarity, means serially connecting the second junction device and the second transistor between the first input terminal and the common terminal, means connecting the base of the second transistor to the anode of the first junction device, means connecting the collector of the second transistor to the base of the third transistor and via said second junction device to the base of the first transistor, a common junction being formed between the first transistor and the first junction device to which the second input terminal is connected, said push-pull output amplifier comprising fourth and fifth transistors of opposite conductivity types connected in series to form a common junction point connected to the op-amp output terminal, third and fourth semiconductor junction devices, means interconnecting the base electrodes of said fourth and fifth transistors via said third and fourth junction devices, means connecting the op-amp input terminal to the base of the fourth transistor via a preamplifier means, means connecting the first input terminal to an output of the current source circuit and the second input terminal to the op-amp input terminal via a high-pass network, and means connecting the first output terminal to the base of the fourth transistor and the second output terminal to the base of the fifth transistor.

10. An operational amplifier as claimed in claim 9 further comprising first and second voltage supply terminals, means connecting the push-pull output amplifier across said supply terminals, means coupling the input of the current source circuit to the first supply terminal, and means connecting the common terminal of the drive amplifier to the second supply terminal.

11. An operational amplifier as claimed in claim 10 further comprising a current mirror circuit having an input, an output and a common terminal, means connecting the current mirror common terminal to the first supply terminal, means connecting the input of the current source circuit to the input of the current mirror and the output of the current mirror to the first output of the drive amplifier.

12. An operational amplifier as claimed in claim 9 wherein said third and fourth junction devices comprise a sixth transistor and a seventh transistor connected as a diode, said sixth and seventh transistors being serially connected to the drive amplifier second output terminal, the base electrodes of the fourth and fifth transistors being interconnected by the series connection of the base-emitter junction of the sixth transistor and the rectifying junction of the seventh transistor, both connected with the same polarity.

* * * * *

UNITED STATES PATENT AND TRADEMARK OFFICE
CERTIFICATE OF CORRECTION

PATENT NO. : 4,013,973
DATED : March 22, 1977
INVENTOR(S) : RUDY JOHAN VAN DE PLASSCHE It is certified that error appears in the above—identified patent and that said Letters Patent are hereby corrected as shown below:

Column 3, line 34, after "path" it should be --. The--.

Signed and Sealed this ninth Day of August 1977

[SEAL]

Attest:

RUTH C. MASON
Attesting Officer

C. MARSHALL DANN
Commissioner of Patents and Trademarks